United States Patent [19]

Ericson et al.

[11] Patent Number: 5,327,029
[45] Date of Patent: Jul. 5, 1994

[54] LOGARITHMIC CURRENT MEASUREMENT CIRCUIT WITH IMPROVED ACCURACY AND TEMPERATURE STABILITY AND ASSOCIATED METHOD

[75] Inventors: M. Nance Ericson; James M. Rochelle, both of Knoxville, Tenn.

[73] Assignee: Martin Marietta Energy Systems, Inc., Oak Ridge, Tenn.

[21] Appl. No.: 58,654

[22] Filed: May 6, 1993

[51] Int. Cl.[5] ............................................. G06G 7/24
[52] U.S. Cl. .................................... 307/491; 307/492; 307/310; 307/1; 328/145
[58] Field of Search .................. 307/491, 492, 310; 328/145

[56] References Cited

U.S. PATENT DOCUMENTS

| | | | |
|---|---|---|---|
| 3,728,636 | 4/1973 | Hill | 307/492 |
| 3,967,105 | 6/1976 | Harrington | 307/492 |
| 4,004,141 | 1/1977 | Curtis | 328/145 |
| 4,475,103 | 10/1984 | Brokaw et al. | 340/501 |
| 4,604,532 | 8/1986 | Gilbert | 328/145 |
| 5,057,717 | 10/1991 | Kimura | 307/492 |
| 5,081,378 | 1/1992 | Watanabe | 307/491 |

OTHER PUBLICATIONS

"Proceedings of the Second ARM Science Team Meeting", dated Oct. 26-30, 1991.
"Log Converters" (undated), National Semiconductor Application Note 30.
"Theory and Applications of Logarithmic Amplifiers" (undated), National Semiconductor Application Note 311.
"Miniaturized logarithmic count-rate circuit", *Rev. Sci. Instrum.* vol. 4, No. 11, Nov. 1973.

Primary Examiner—William L. Sikes
Assistant Examiner—Tuan T. Lam
Attorney, Agent, or Firm—Michael E. McKee; James M. Spicer; Harold W. Adams

[57] ABSTRACT

A logarithmic current measurement circuit for operating upon an input electric signal utilizes a quad, dielectrically isolated, well-matched, monolithic bipolar transistor array. One group of circuit components within the circuit cooperate with two transistors of the array to convert the input signal logarithmically to provide a first output signal which is temperature-dependant, and another group of circuit components cooperate with the other two transistors of the array to provide a second output signal which is temperature-dependant. A divider ratios the first and second output signals to provide a resultant output signal which is independent of temperature. The method of the invention includes the operating steps performed by the measurement circuit.

11 Claims, 7 Drawing Sheets

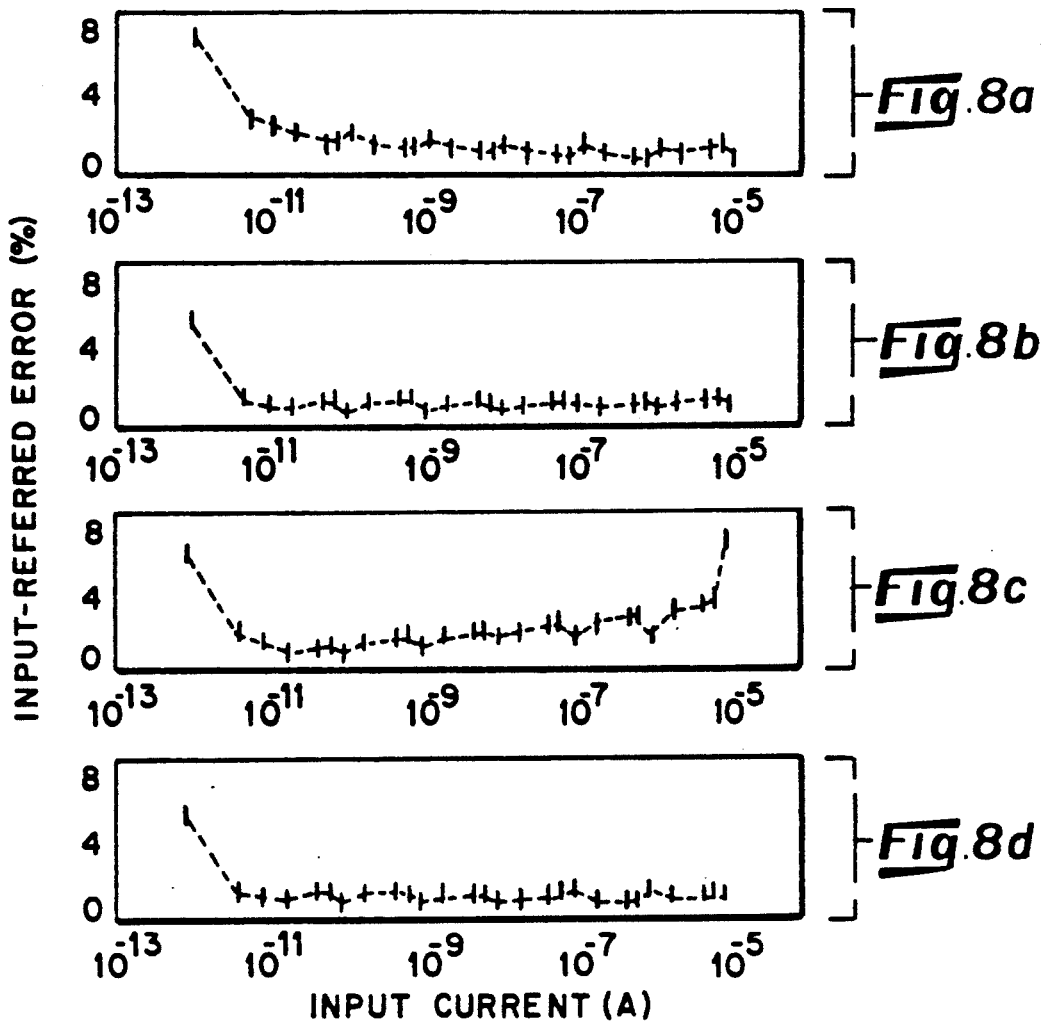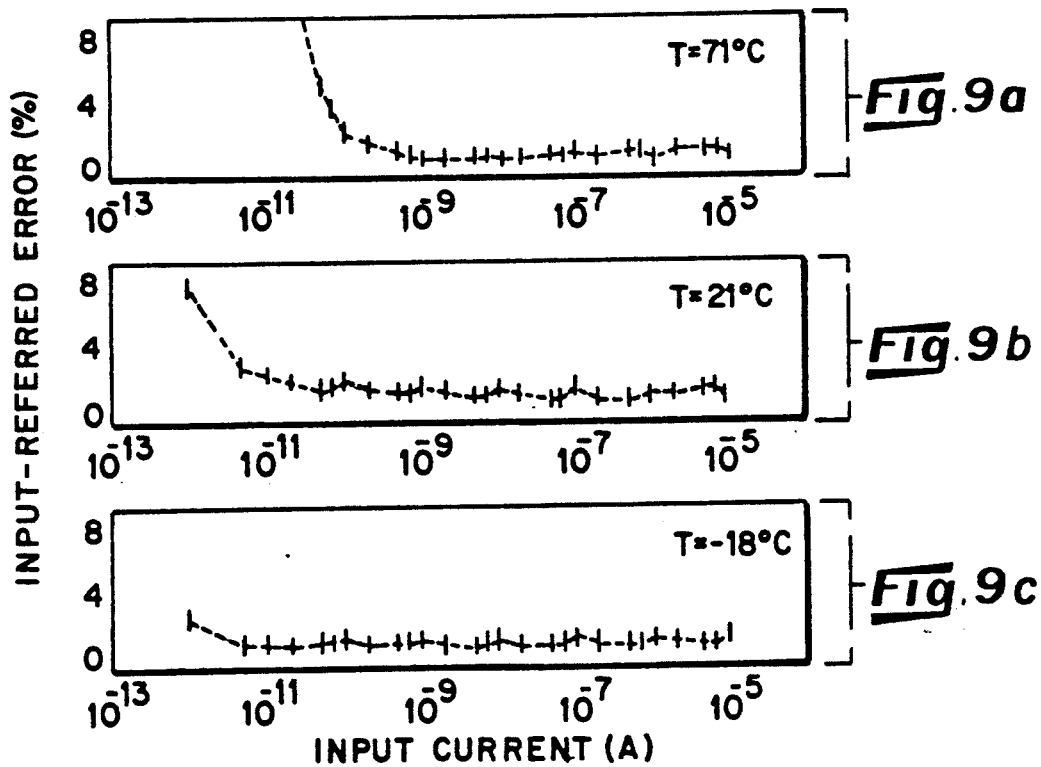

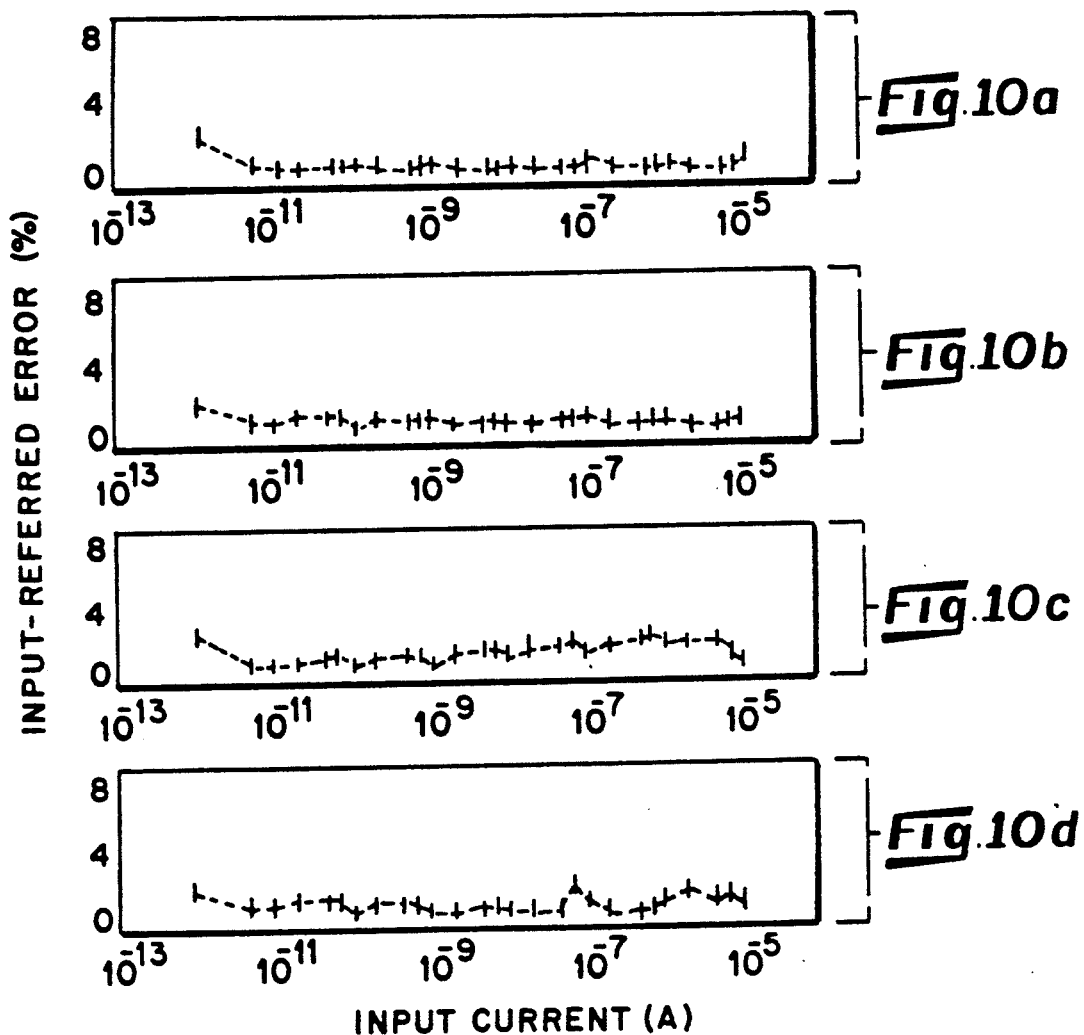

LOGARITHMIC CURRENT MEASUREMENT CIRCUIT WITH IMPROVED ACCURACY AND TEMPERATURE STABILITY AND ASSOCIATED METHOD

BACKGROUND OF THE INVENTION

This invention relates generally to means and methods for obtaining measurements and relates, more particularly, to solid state measurement circuits.

The circuits with which the present invention is to be compared are logarithmic signal processing circuits commonly used in instrumentation applications. These circuits of the prior art commonly utilize a bipolar transistor employing a matched pair of transistors connected for logarithmic current measurement. However, unless means are incorporated within the circuit to compensate for the intrinsic temperature variations of the transistor pair, measurements obtained with the circuit may be inaccurate.

A temperature-sensing resistor (i.e. of a predetermined temperature coefficient) can be utilized within the logarithmic circuit to compensate for the aforementioned intrinsic temperature variations, but the resulting circuit is limited in several respects. For example, the resistors do not possess precise resistance versus temperature characteristics necessary to provide accurate compensation over a relatively broad range of operating temperatures. Furthermore, because the compensating resistors and the log transistor chip may be at slightly different temperatures due, at least in part, to different self-heating rates of the two devices and because the compensation resistor does not correct for variations in the emission coefficient of the log transistor pair, temperature compensation is imperfect. Moreover, the temperature coefficient of the compensating resistor has a poor tolerance rendering the circuit not compatible with high-volume production techniques. Still further, the prior art circuit is further limited in that it is not compatible with the possible use of a small thermoelectric cooler to cool the log transistor pair for the purpose of reducing measurement errors due to leakage current and extending the useful measurement range well below 1 pA. Still further, the prior art temperature compensation means normally require precise scale factor calibration of the log conversion function and thus require the use of a manually trimmed resistor locally in the log converter circuit rather than the often preferred approach of computer-assisted scale factor correlation after the measurements have been digitized.

It is an object of the present invention to provide a new and improved circuit and an associated method for logarithmically measuring current which circumvents the aforementioned limitations associated with circuits of the prior art which employ temperature compensating resistors.

Another object of the present invention is to provide such a circuit which provides an output signal which is totally independent of temperature.

Still another object of the present invention is to provide such a circuit which possesses a high degree of accuracy over a relatively large decade range of input signal.

Yet another object of the present invention is to provide such a circuit which is uncomplicated in construction and effective in operation.

SUMMARY OF THE INVENTION

This invention resides in a logarithmic measurement circuit and method for operating upon an input electric current.

The circuit includes a quad array of dielectrically isolated, well-matched bipolar transistors and first circuit means associated with the quad array. The first circuit means includes a first operational amplifier, a first divider including a first resistor and a second resistor, and a current regulator which cooperate with a first two transistors of the quad array for converting the input signal $I_{SIGNAL}$ logarithmically to provide a first output signal $V_{OUT1}$ in accordance with the equation:

$$V_{OUT1} = N_1(1 + R_2/R_1)(k/q)T_1 ln(10) log(I_{REF}/I_{SIGNAL})$$

wherein $N_1$ is the emission coefficient of the first two transistors of the quad array, $R_1$ is the first resistor, $R_2$ is the second resistor, k is Boltzman's constant, q is the electronic unit charge, $T_1$ is the absolute temperature of the first two transistors in degrees Kelvin, and $I_{REF}$ is the reference current transmitted through the current regulator.

The circuit also includes second circuit means associated with the quad array for biasing the second two transistors at a fixed collector ratio and including a second operational amplifier, a second divider including a third resistor and a fourth resistor which cooperate with the second two transistors of the quad array to provide a second output signal $V_{OUT2}$ in accordance with the equation:

$$V_{OUT2} = N_2(1 + R_4/R_3)(k/q)T_2 ln(10) log(K_i)$$

wherein $N_2$ is the emission coefficient of the second two transistors of the quad array, $R_3$ is the third resistor, $R_4$ is the fourth resistor, k is Boltzman's constant, q is the electronic unit charge, $T_2$ is the absolute temperature of the second two transistors in degrees Kelvin, and $K_i$ is the ratio of fixed collector currents for the second two transistors.

The circuit also includes means connected to the first and second circuit means for ratioing the first and second output signals $V_{OUT1}$ and $V_{OUT2}$ to provide a resultant output signal $V_{OUT}$ which corresponds to the following equation:

$$V_{OUT} = V_{OUT1}/V_{OUT2} = [(1+R_2/R_1)/(1+R_4/R_3)] log(I_{REF}/I_{SIGNAL})/log(K_i)$$

so that the resultant output signal $V_{OUT}$ is temperature independent.

The method of the invention includes the steps performed by the circuit of the invention. In particular, a first two of the transistors in the quad array is utilized to convert an input signal logarithmically to provide a first output signal which is dependent upon the temperature of the first two transistors in the array. The second two transistors of the quad array, which are biased at a fixed collector ratio, are utilized to provide a second output signal which is dependant upon the temperature of the second two transistors in the array. The first and second output signals are then ratioed to provide a resultant output signal which is temperature independent.

A circuit in accordance with the present invention can be used to provide improved performance in any of a number of applications where current from a sensor needs to be precisely measured over a large number of decades of dynamic range and/or within a relatively broad temperature range. Such applications include photodiode sensor measurements use din detection and chemical analysis of liquids and gases and radiometers used in atmospheric and space studies, nuclear particle detectors and radiation monitoring applications, medical applications such as blood analyzers and CAT scanners, pH meters, lead detectors, mass spectrometers, photomultipliers and vacuum gauges.

BRIEF DESCRIPTION OF THE DRAWINGS

FIGS. 8a–8d are test result graphs showing input-referred measurement errors obtained with the FIG. 2 circuit at 21° C.

FIGS. 9a–9c are test result graphs showing input-referred measurement errors obtained with the FIG. 2 circuit over a broad temperature range.

FIGS. 10a–10d are test result graphs showing input-referred measurement errors obtained with the FIG. 2 circuit at −17.8° C.

DETAILED DESCRIPTION OF ILLUSTRATED EMBODIMENTS

Figure 1:
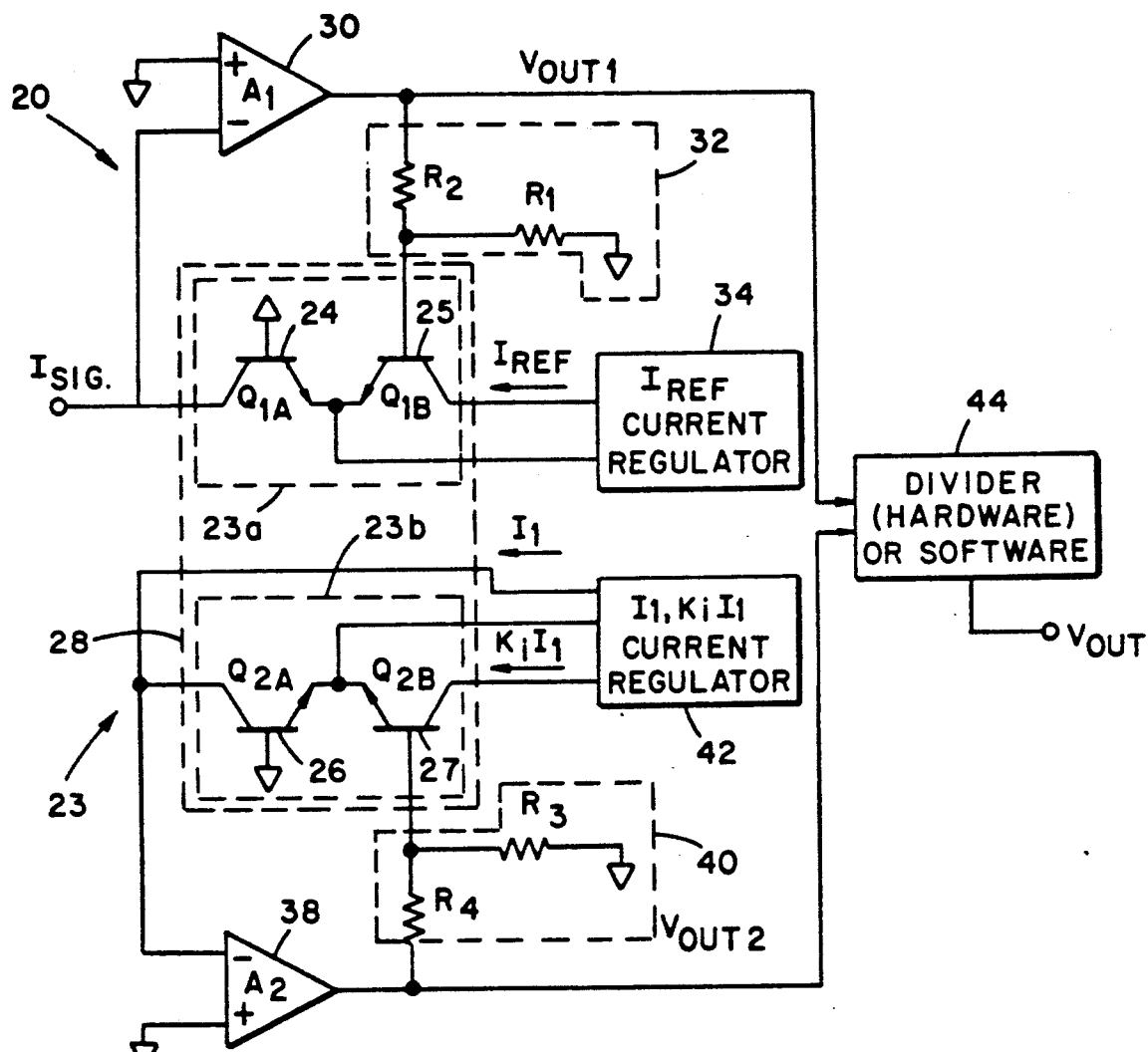
FIG. 1 is a topology view of one embodiment of a seven-decade temperature-compensated logarithmic amplifier embodying features of the present invention.

Turning now to the drawing in greater detail there is shown in FIG. 1 one embodiment of an electric circuit, generally indicated 20, within which features of the present invention are embodied. As will be apparent herein, the circuit 20 performs a logarithmic analysis upon an input electric current $I_{SIGNAL}$ so as to provide a resultant output voltage signal $V_{OUT}$ which i independent of the temperature of the circuit 20, or more specifically, the componentry of the circuit 20.

Although the circuit 20 is described herein as being used in the logarithmic measurement of current, a circuit in accordance with the broader aspects of the invention can be used in voltage-measurement applications wherein an input voltage signal is converted to a current and then processed in accordance with the method of the present invention. Accordingly, the principles of the present invention can be variously applied.

With reference still in FIG. 1, the circuit 20 includes a quad, well-matched bipolar transistor array 23. The transistors in one, or a first, transistor pair 23a of the array 23 are designated 24, 25, and the transistors in the other, or second, transistor pair 23b of the array 23 are designated 26, 27. Support means 28 associated with the array 23 support the transistor pairs 23a, 23b in relatively close proximity to one another, yet dielectrically isolate the transistors from one another. Such isolation can be effected by isolating the transistors from an underlying substrate by a layer of Silicon Oxide ($SiO_2$). The support means 28 may take the form of a support base upon which the array 23 is mounted or a single monolithic ship within which the quad 23 is integrated. By physically arranging the transistor pairs 23a, 23b relatively close together, the temperatures of the transistor pairs 23a, 23b are substantially equal, and the advantage of such a consequence will be apparent herein.

The circuit 20 also includes a first integrated circuit operational amplifier 30 and a divider 32 comprised of two resistors $R_1$ and $R_2$. The operational amplifier 30 and divider 32 are electrically connected to the first transistor pair 23a of the quad array 23, and current regulator means 34 are connected about the transistor 25 in the manner depicted in FIG. 1. Together, the amplifier 30, divider 32, current regulator 34 and transistor pair 23a generates a logarithmic output voltage $V_{OUT1}$ for a linear input current $I_{SIGNAL}$.

Logarithmic converter circuits utilizing a bipolar transistor are well known in the art so that a more detailed description of the logarithmic conversion operation with the transistor pair 23 is not believed to be necessary. Suffice it to say that in the circuit 20, transistor 24 operates as a non-linear feedback element around the operational amplifier 30, and negative feedback is applied to the emitter of transistor 24 through divider 32 and the emitter base junction of transistor 25. Transistor 25 is connected to the current regulator 34 for receiving a reference current $I_{REF}$. Since the transistors 24, 25 are matched and at the same temperature, the aforementioned transistor pair 23a, amplifier 30, divider 32 and current regulator 34 cooperate with one another to provide a first output voltage $V_{OUT}$ for an input current $I_{SIGNAL}$ corresponding to the equation:

$$V_{OUT1} = K_1 \log(I_{REF}/I_{SIGNAL})$$

where $$K_2 = N_1(1 + R_2/R_1)(kT_1/q)ln(10)$$

and $N_1$ is the emission coefficient of the first transistor array 23a, k is Boltzman's constant, q is the electronic unit charge, and $T_1$ is the absolute temperature of the transistor pair 23a in degrees Kelvin.

The second transistor pair 23b of the quad array 23 is based at a fixed collector current ratio, which is 10:1 in the depicted embodiment, to perform a temperature measurement function. To this end, a second operational amplifier 38, a second divider 40 (Having resistors $R_3$ and $R_4$) and a second current regulator 42 are electrically connected to the transistors 26 and 27 in the manner depicted in FIG. 1. Moreover, the second current regulator 42 is designed to regulate or ensure that the current transmitted through the second transistor pair 23b is related to the $I_{REF}$ transmitted through the first current regulator 34 by a factor of ten. The aforementioned transistors 26, 27 second divider 40, and second current regulator 42 cooperate to generate a second logarithmic output $V_{OUT2}$ as a function of temperature $T_2$ in accordance with the equation:

$$V_{OUT2} = N_2(1 + R_4/R_3)(kT_2/q)ln(10)\log(K_i)$$

wherein $N_2$ is the emission coefficient of the second transistor pair 23b, k is Boltzman's constant, q is the electronic unit charge, $T_2$ is the absolute temperature of the transistor pair 23b in degrees Kelvin, and $K_1$ is the ratio (10 in the depicted embodiment) of the fixed collector currents in the second transistor pair 23b.

The circuit 20 also includes means, indicated 44, for ratioing the first logarithmic output $V_{OUT1}$ and second logarithmic output $V_{OUT2}$. Accordingly, the ratioing means 44, provided for example by a divider (hardware or software), is connected within the circuit 20 as shown in FIG. 1 for receiving the outputs $V_{OUT1}$ and $V_{OUT2}$. Since the transistors 24, 25, 26, 27 are matched with one another and the temperatures of the transistor pairs 23a and 23b are the same, several of the variables of the aforementioned equations cancel one another during the ratioing operation so that the resultant voltage output $V_{OUT}$ provided by the ratioing means 44 corresponds with the equation:

$$V_{OUT} = V_{OUT1}/V_{OUT2} = [(1+R_2/R_1)/(1+R_4/R_3)] \log(I_{REF}/I_{SIGNAL})/\log(K_i)$$

It will be noted that the resultant output voltage $V_{OUT}$ in the foregoing equation is totally temperature independent. Instead, the output voltage $V_{OUT}$ only depends upon the resistors of the dividers 32 and 40 and the input and reference currents $I_{SIGNAL}$ and $I_{REF}$. Moreover, because the output voltage $V_{OUT}$ is temperature independent, the circuit 20 does not require a particular scale factor calibration (e.g., as set by the $R_2/R_1$ and $R_4/R_3$ ratios) as do circuits of the prior art which utilize a temperature-sensing resistor of a particular temperature coefficient. Thus, in applications where current measurement are processed digitally under computer control, the final scale factor calibration can also be done under computer control without requiring any manual trimming of $R_2/R_1$ or $R_4/R_3$.

Figure 2:
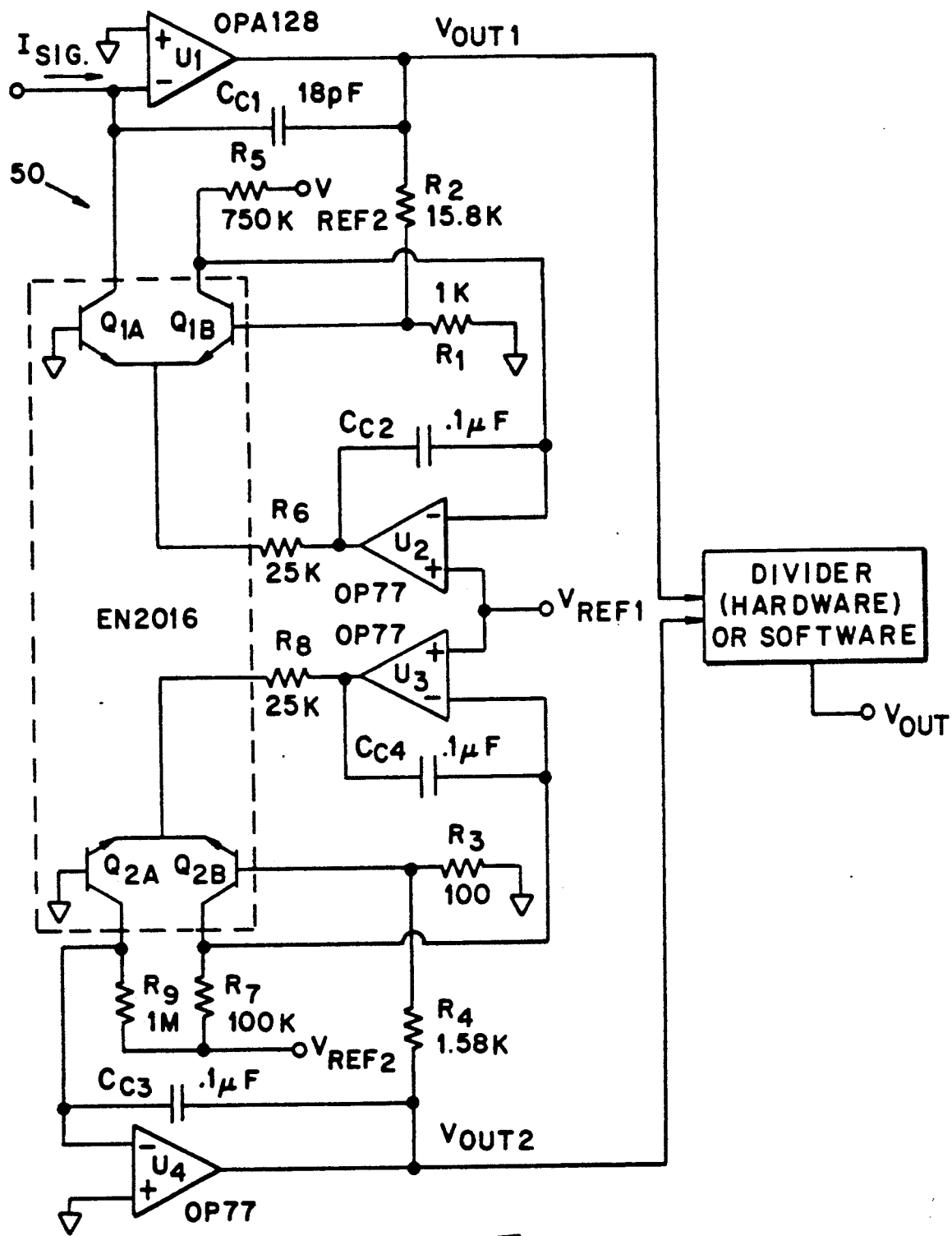
FIG. 2 is a circuit schematic of another embodiment of a seven-decade temperature-compensated logarithmic amplifier embodying features of the present invention.

With reference to FIG. 2, there is illustrated schematically another embodiment, indicated 50, of a temperature-compensated logarithmic amplifier circuit with illustrative identification values denoted alongside each component of the circuit 50. In the depicted circuit 50, a nominal 300-K log conversion scale factor of $V_{OUT1}$ is set at 1 V/decade by $R_1$ and $R_2$. The $V_{OUT2}$ channel is also set to a nominal 300-K level of 1 V by $R_3$ and $R_4$. These resistors $R_1$, $R_2$, $R_3$, and $R_4$ were chosen for the FIG. 2 circuit 50 to have low values to minimize the output offset due to $Q_{1B}$ and $Q_{2B}$ base current.

Figure 3:
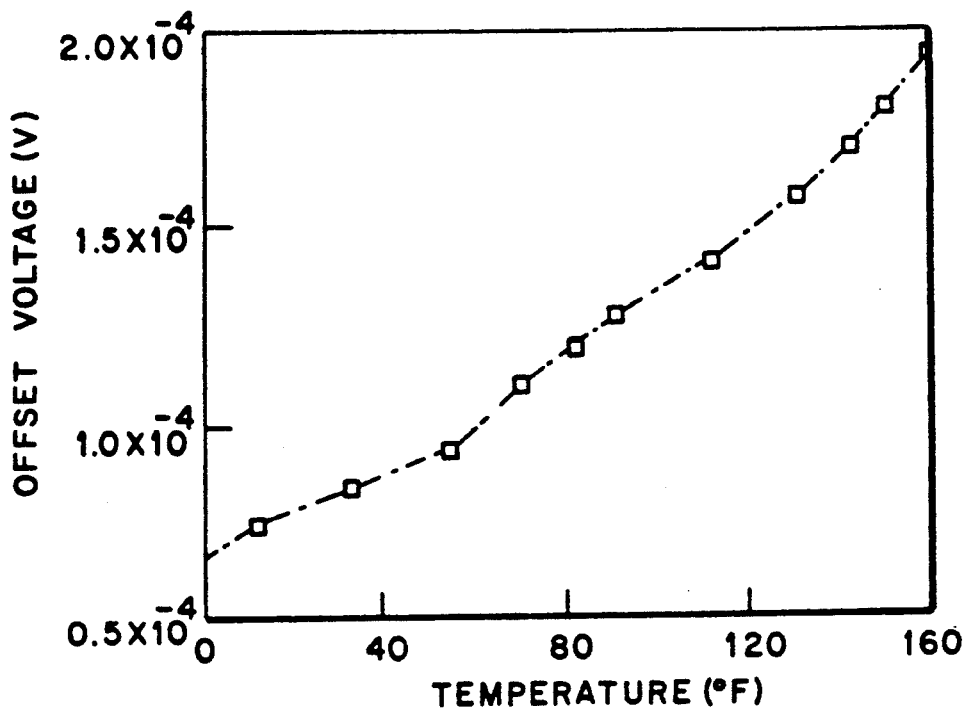
FIGS. 3 and 4 are graphs showing the measured input offset voltage and input bias current versus temperature for an operational amplifier (opamp) used in the FIG. 2 circuit.
Figure 4:
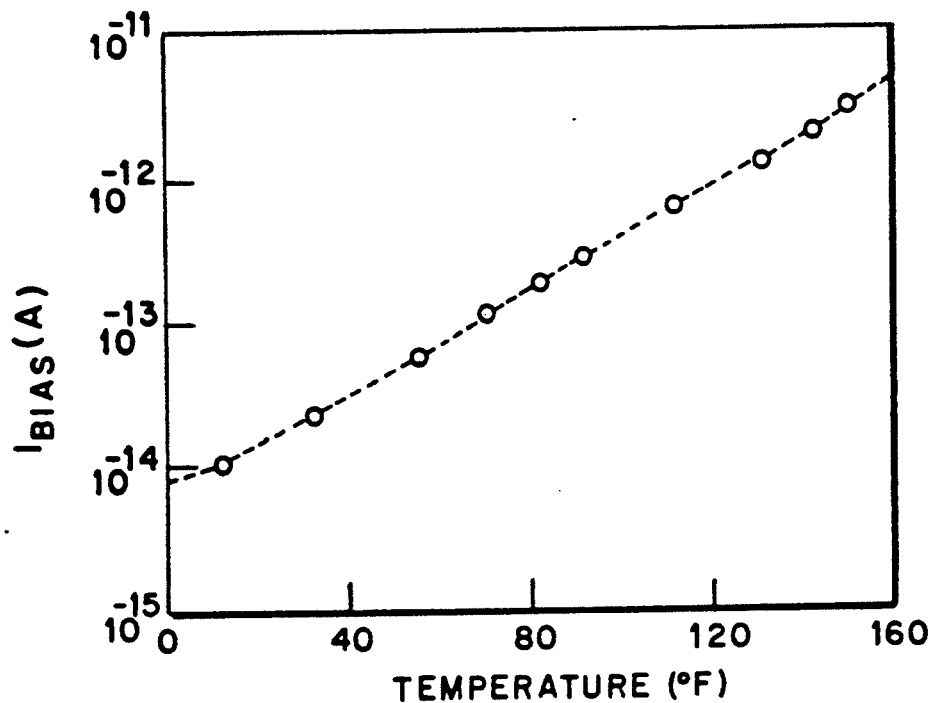

All leakage currents at the input node add to or subtract from the input signal, directly contributing an input error. For this reason, the input devices were carefully selected to provide the best accuracy over temperature. Moreover, the input operational amplifier (opamp) $U_1$ was chosen for its combination of low offset voltage, low-input bias current, and good gain-band width product. FIGS. 3 and 4 show the measured input offset voltage and input bias current versus temperature, respectfully, for the OPA128LM opamp $U_1$ which has dielectrically isolated junction field-effect transistor (JFET) input devices.

Figure 5:
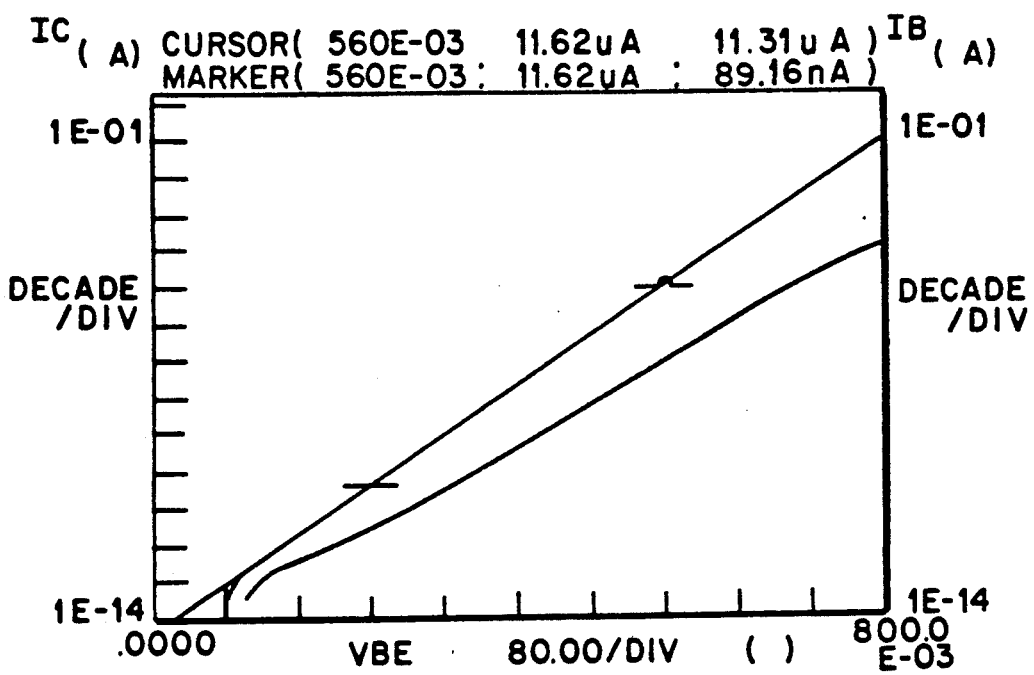
FIG. 5 is a graph showing the Gummel plot for a quad array employed in the FIG. 2 circuit.
Figure 6:
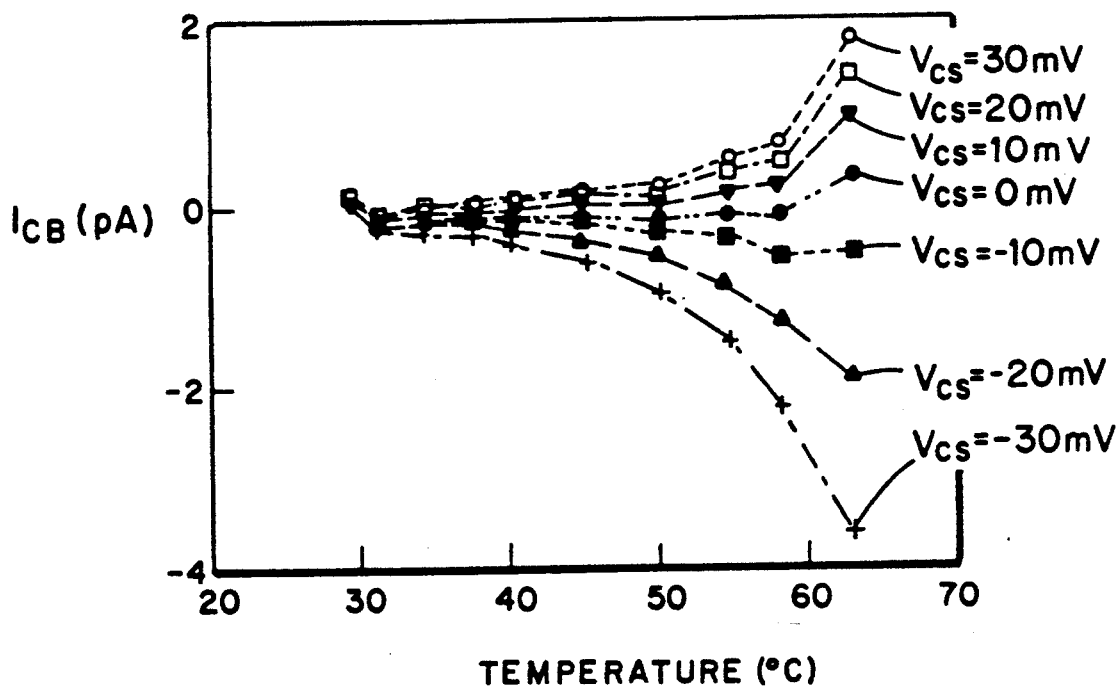
FIG. 6 is a graph showing a plot of the collector-based leakage current as a function of temperature and $V_{CB}$ of the FIG. 2 circuit.

Extensive device testing was performed for selection of the logarithmic transistor set. FIG. 5 shows the Gummel plot for the EN2016 quad npn transistor array. This EN2016 array exhibited good logarithmic conformance over 8 decades and reasonable $h_{fe}$ at low collector currents. The collector-base leakage current as a function of temperature and $V_{CB}$ is plotted in FIG. 6. To reduce the collector-base leakage current $I_{CB}$ (which is a function of $V_{CB}$), the opamp $U_1$ needs to have low-input offset voltage.

The reference currents $I_{CQ1B}$, $I_{CQ2A}$, and $I_{CQ2B}$ are generated by fixing precision voltages across stable resistors. Errors in these currents result from errors in the resistance values and reference voltages as well as input offset voltages and bias currents of the opamps used to control the current regulation loops. These errors are minimized by using an accurate voltage reference with low temperature coefficient, precision resistors with low temperature coefficient (0.1% resistance tolerance with 2 ppm/C TC available), and opamps with low-input offset voltages and input bias currents. A multiple output voltage reference (AD584) was used globally in the circuit 50. The output voltages for this reference were measured as a function of temperature and found to deviate less than 0.1% from the nominal values over the entire temperature range. The OP77EZ used for opamps U, U and U has guaranteed maximum-input bias current and input offset voltage to four nA and forty-five $\mu V$, respectively, contributing negligible error to the source current.

Compensation capacitors $C_{C1}$, $C_{C2}$, $C_{C3}$ and $C_{C4}$ were used to frequency-stabilize the four gain loops. A polystyrene capacitor was used for capacitor $C_{C1}$ to minimize leakage current into the input node.

Figure 7A:
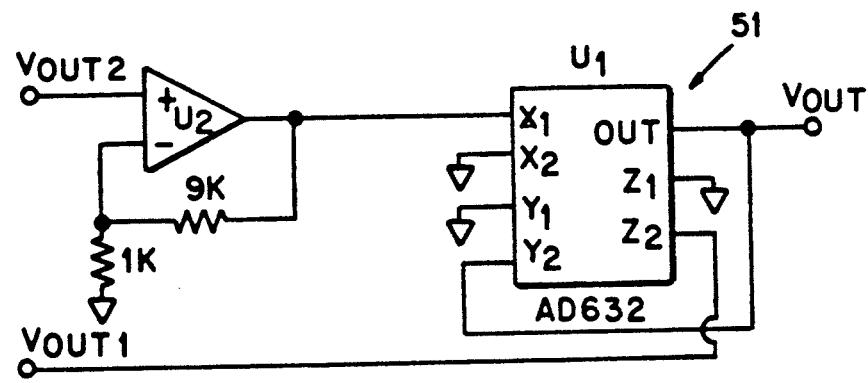
FIGS. 7a and 7b are schematic views of ratioing circuits used to test the circuit of FIG. 2.
Figure 7B:
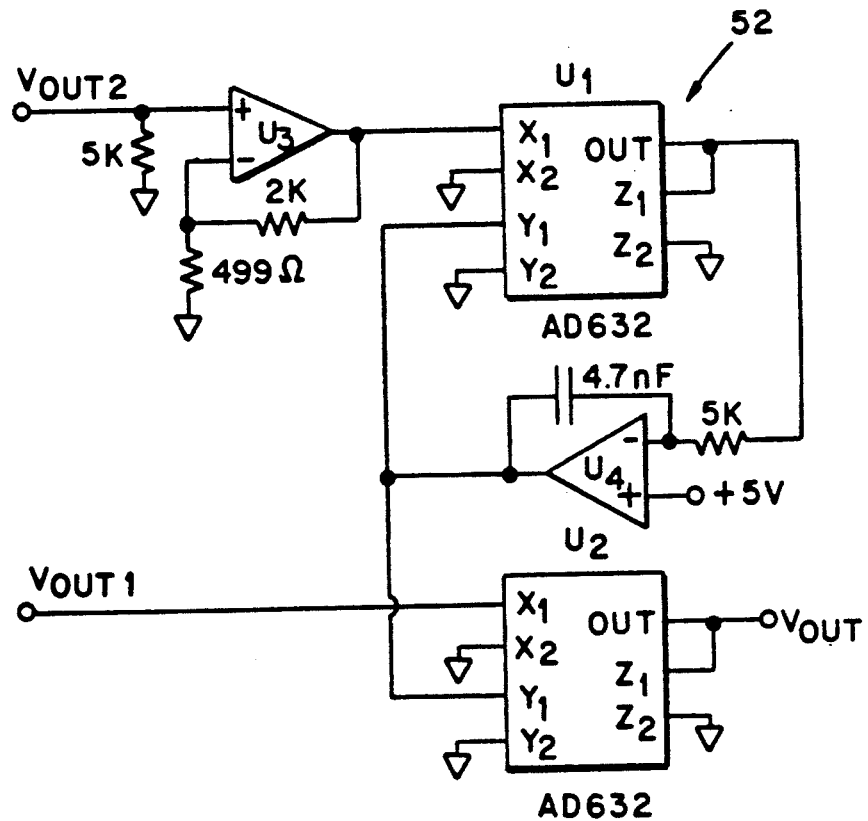

Two ratioing circuits, depicted as networks 51 and 52 in FIGS. 7a and 7b, respectively, were implemented to test the hardware ratioing of the two temperature-dependant output voltages $V_{OUT1}$ and $V_{OUT2}$. In FIG. 7a, and AD632 analog multiplier is connected as a divider, and the denominator $V_{OUT2}$ is multiplied by ten to account for the gain in the transfer function of the divider. This circuit represents the simplest, untrimmed implementation of the divide function. The analog ratio circuit of FIG. 7b was also implemented and tested. This FIG. 7b circuit requires two AD632 chips, but both are used in the multiplier mode, which is more tightly specified by the manufacture than the divider mode. The $U_1$–$U_4$ loop of the FIG. 7b circuit essentially computes a multiplier factor that normalizes the amplified $V_{OUT2}$ signal to a 5-V reference. The $V_{OUT1}$ log signal is then normalized by the same factor. In the FIG. 7b circuit, offset trimming of opamp $U_2$ is accomplished with $V_{OUT2}$ present and the $U_4$ reference input switched from five V to ground. Offset trimming of the opamp $U_2$ is accomplished with its $X_1$ input grounded.

The use of well-matched monolithic transistors and appropriate circuit components eliminates the larger sources of error that result from component offset errors and temperature coefficients. However, very small scale factor errors were shown to produce appreciable input-referred errors. For this reason, a gain adjustment is needed to perform the necessary log conversion slope adjustment of the output signal ratio. This can be implemented by physically trimming one of the $R_2/R_1$ or $R_4/R_3$ ratios or by a host processor in instruments using digital data acquisition. In either case, only a single point calibration is required, preferably in the lower decades, provided offset errors are negligible. This level should be chosen at a current level large enough to be unaffected by input leakage current errors but small enough to benefit from improved resolution. Accuracy will be further maximized if the temperature at which the calibration is performed is close to the expected operating temperature range. The calibration factor is then applied to all of the measured rations. Data referred to hereinafter reflect calibration procedures performed at both −18° C. and 21° C.

Experimental Results

The circuit 50 of FIG. 2 and the divider circuits 51 and 52 of FIGS. 7a and 7b, respectively, were fabricated and then tested in an environmental chamber. A Keithley Model 261 Picoampere Current Source was used as the input current source. A premeasurement hardware trim was performed to adjust the log conversion scale factor. The logarithmic amplifier output $V_{OUT1}$, the temperature-tracking voltage source output $V_{OUT2}$, and the outputs of the two divider networks 51 and 52 were recorded for each input current setting from 1 pA to 10 μA over a temperature range of −18° to 71° C. (0° to 160° F.). To establish a value for the theoretical input current, three samples were measured at each setting by using a Keithley Model 617 Programmable Electrometer and the average value calculated. Calibration factors for each of the ratioing techniques (software divide and hardware divider networks 51 and 52) were calculated for the 21° C. and −18° C. measurements at a 100-pA nominal input current by using the theoretical value. Each of the resulting ratios was multiplied by the appropriate calibration factor prior to calculating the measured input current and input-referred measurement error.

With reference to FIGS. 8a–8d, there is shown the input-referred measurement errors for uncalibrated computer-ratioed data and for calibrated data ratioed by using computer division and analog dividers 51 and 52. More specifically, FIG. 8a shows the measurement errors for uncalibrated computer-ratioed data; FIG. 8c shows the measurement errors for calibrated divider 51 ratioed data; and FIG. 8d shows the measurement errors for calibrated divider 52 ratioed data. Calibration factors were determined by using 21° C. 100-pA measurements. The results (FIG. 8c) for the divider network 51 shows significant offset error and increased error as the denominator approaches zero V (at full-scale 10 μA). Divider network 52 (FIG. 8d) has much improved performance with less than 1.0 percent error for over six decades.

Input-referred errors at various temperatures are plotted against input current in FIGS. 9a–9c to provide an overall temperature performance for the log amp circuit 50. Accurate temperature performance (less than 1.0 percent error) is achieved in the upper five decades over the entire temperature range. The error in the lower two decades can be attributed to device leakage currents and their temperature dependence, and not to the temperature-compensation technique. At temperatures near and below 21° C., less than 1.0 percent error can be achieved over 6.5 decades of signal amplitude.

For improved performance, thermoelectric cooling methods could be used to increase the low-current measurement accuracy. FIGS. 10a–10d demonstrate the performance of the circuit 50 at reduced temperature (i.e., −17.8° C.). More specifically, FIG. 10a shows uncalibrated computer-ratioed data; FIG. 10b shows calibrated computer-ratioed date; FIG. 10c shows calibrated divider 51 ratioed data; and FIG. 10d shows calibrated divider 52 ratioed data. Calibration factors were calculated from −17.8° C. 100-pA data. Divider networks 51 and 52 demonstrate similar performance (in FIGS. 10b and 10c), with errors less than 2.0 percent over seven decades; and calibrated data ratioed by using a computer (FIG. 10d) show less than 1.2 percent error over seven decades or less than 1.0% error over 6.5 decades.

It should be noted that much of the error shown in FIGS. 8a–8d, 9a–9d, and 10a–10d can be attributed to errors in the current source used to perform the experiments. Moreover, variations of up to ±0.5% were observed over the course of the measurements.

It follows from the foregoing that a seven-decade, high-accuracy, temperature-compensated logarithmic amplifier has been developed and demonstrated. Limitations resulting from the use of conventional temperature-compensation methods have been eliminated by the use of a quad, dielectrically isolated, well-matched, monolithic, bipolar transistor array. Errors of less than 1.0 percent have been demonstrated for five decades over an extended temperature range (−18° C. to 71° C.) and for 6.5 decades for temperatures below 21° C. Full seven-decade accuracy to within 1.0 percent is attainable by using thermoelectric or other suitable cooling methods to reduce device leakage currents. Errors resulting from variable forward current emission coefficients of the logarithmic elements are eliminated with the circuit design of this invention. Single-point calibration is easily performed by either hardware trimming or software computation. Compact construction and straightforward calibration make the design suitable for high-accuracy, multichannel applications.

It will be understood that numerous modifications and substitutions can be had to the aforedescribed embodiments without departing from the spirit of the invention. Accordingly, the aforedescribed embodiments are intended for the purpose of illustration and not as limitation.

What is claimed is:

1. A logarithmic measurement circuit for operating upon an input electric signal $I_{SIGNAL}$ comprising:
   a quad array of dielectrically isolated, well-matched bipolar transistors;
   first circuit means associated with the quad array including a first operational amplifier, a first divider including a first resistor and a second resistor, and a current regulator which cooperate with a first two transistors of the quad array for converting the input signal $I_{SIGNAL}$ logarithmically to provide a first output signal $V_{OUT1}$ in accordance with the equation:

$$V_{OUT1} = N_1(1 + R_2/R_1)(k/q)T_1 ln(10) log(I_{REF}/I_{SIGNAL})$$

wherein N is the emission coefficient of the first two transistors of the quad array, $R_1$ is the first resistor, $R_2$ is the second resistor, k is Boltzman's constant, q is the electronic unit charge, $T_1$ is the absolute temperature of the first two transistors in degrees Kelvin, and $I_{REF}$ is the reference current transmitted through the current regulator;
   second circuit means associated with the quad array for biasing the second two transistors at a fixed collector current ratio and including a second operational amplifier, a second divider including third and fourth resistors which cooperate with the second two transistors of the quad array to provide a second output signal $V_{OUT2}$ in accordance with the equation:

$$V_{OUT2} = N_2(1 + R_4/R_3)(k/q)T_2 ln(10) log(K_i)$$

wherein $N_2$ is the emission coefficient of the second two transistors of the quad array, $R_3$ is the third resistor, $R_4$ is the fourth resistor, k is Boltzman's constant, q is the electronic unit charge, $T_2$ is the absolute temperature of the second two transistors in degrees Kelvin, and $K_i$ is the ratio of the fixed collector currents on the second two transistors; and means connected to the first and second circuit means for ratioing the first and second output signals $V_{OUT1}$ and $V_{OUT2}$ to provide a resultant output signal $V_{OUT}$ which corresponds to the equation:

$$V_{OUT}=V_{OUT1}/V_{OUT2}=[(1+R_2/R_1)/(1+R_4/R_3)]\log(I_{REF}/I_{SIGNAL})/\log(K_i)$$

so that the resultant output signal $V_{OUT}$ is temperature independent.

2. The circuit as defined in claim 1 wherein the first two transistors and the second two transistors are supported in relatively close physical proximity to one another so that the temperatures of the transistor pairs are substantially the same.

3. The circuit as defined in claim 1 wherein the quad array is integrated within a monolithic semiconductor chip.

4. The circuit as defined in claim 1 wherein the fixed collector ratio of the second two transistors is 10:1.

5. The circuit for logarithmically measuring an input electric current $I_{SIGNAL}$ comprising:

first circuit means for logarithmically converting input electric current $I_{SIGNAL}$ to provide a first output signal $V_{OUT1}$ wherein the first circuit means includes a first pair of transistors, a first operational amplifier, a divider including first and second resistors and a first current regulator and wherein the first output signal $V_{OUT1}$ corresponds to the equation:

$$V_{OUT1}=N_1(1+R_2/R_1)(k/q)T_1 ln(10)\log(I_{REF}/I_{SIGNAL})$$

wherein $N_1$ is the emission coefficient of the first two transistors, $R_1$ is the first resistor, $R_2$ is the second resistor, k is Boltzman's constant, q is the electronic unit charge, $T_1$ is the absolute temperature of the first transistor pair in degrees Kelvin, and $I_{REF}$ is the reference current transmitted through the current regulator;

second circuit means for providing a temperature-dependant second output signal $V_{OUT2}$ wherein the second circuit means includes a second pair of transistors which is well-matched to the first transistor pair and which is biased at a fixed collector current ratio, a second operational amplifier, a second divider including third and fourth resistors which cooperate with the second transistor pair to provide a second output signal $V_{OUT2}$ in accordance with the equation:

$$V_{OUT2}=N_2(1+R_4/R_3)(k/q)T_2 ln(10)\log(K_i)$$

wherein $N_2$ is the emission coefficient of the second two transistors, $R_3$ is the third resistor, $R_4$ is the fourth resistor, k is Boltzman's constant, q is the electronic unit charge, $T_2$ is the absolute temperature of the second transistor pair in the degrees Kelvin, and K is the ratio of the fixed collector currents of the second transistor pair; and means connected to the first and second circuit means for ratioing the first and second output signals $V_{OUT1}$ and $V_{OUT2}$ to provide a resultant output signal $V_{OUT}$ which corresponds to the equation:

$$V_{OUT}=V_{OUT1}/V_{OUT2}=[(1+R_2/R_1)/(1+R_4/R_3)]\log(I_{REF}/I_{SIGNAL})/\log(K_i)$$

so that the resultant output signal $V_{OUT}$ is temperature independent.

6. The circuit as defined in claim 5 wherein the first and second transistor pairs are supported in relatively close physical proximity to one another so that the temperatures of the transistors pairs are substantially the same.

7. The circuit as defined in claim 5 wherein the first and second transistor pairs are arranged as a quad array within a monolithic semiconductor chip.

8. The circuit as defined in claim 5 wherein the fixed collector current ratio of the second transistor pair is 10:1.

9. A method for logarithmically operating upon an input electric signal $I_{SIGNAL}$ for measurement purposes comprising the steps of:

providing a quad array of dielectrically isolated, well-matched bipolar transistors and utilizing a first two of the transistors in the quad array to convert the input signal $I_{SIGNAL}$ logarithmically to provide a first output signal $V_{OUT1}$ which is dependent upon the temperature of the first two transistors in the array;

biasing the second two of the transistors of the quad array at a fixed collector current ratio and utilizing the second two transistors to provide a second output signal $V_{OUT2}$ which is dependent upon the temperature of the second two transistors in the array; and ratioing the first and second output signals $V_{OUT1}$ and $V_{OUT2}$ to provide a resultant output signal $V_{OUT}$ which is temperature independent.

10. The method as defined in claim 9 wherein the step of ratioing is effected by hardware means.

11. The method as defined in claim 9 wherein the step of ratioing is effected by software means.

* * * * *